United States Patent [19]

Hoffman et al.

[11] Patent Number: 5,369,392

[45] Date of Patent: Nov. 29, 1994

[54] METHOD AND APPARATUS FOR INDICATING FAULTS IN SWITCH-TYPE INPUTS

[75] Inventors: John P. Hoffman, Peoria; Ricky D. Vance, Washington, both of Ill.

[73] Assignee: Caterpillar Inc., Peoria, Ill.

[21] Appl. No.: 945,452

[22] Filed: Sep. 16, 1992

[51] Int. Cl.5 .............................................. B60Q 1/00
[52] U.S. Cl. .................................. 340/438; 340/459; 340/461; 340/462; 340/525
[58] Field of Search ............... 340/438, 459, 461, 462, 340/525, 518

[56] References Cited

U.S. PATENT DOCUMENTS

| | | | |
|---|---|---|---|
| 3,516,063 | 6/1970 | Arkin et al. | 340/518 |
| 3,866,166 | 2/1975 | Kerscher, III et al. | 340/52 F |
| 4,053,868 | 10/1977 | Cox et al. | 340/52 F |
| 4,072,925 | 2/1978 | Yashima et al. | 340/52 F |
| 4,128,005 | 12/1978 | Arnston et al. | 73/117.3 |
| 4,223,302 | 9/1980 | Hocking | 340/518 |
| 4,271,402 | 6/1981 | Kastura et al. | 340/52 F |
| 4,376,298 | 3/1983 | Sokol et al. | 364/551 |
| 4,497,057 | 1/1985 | Kato et al. | 371/29 |
| 4,521,885 | 6/1985 | Melocik et al. | 371/29 |
| 4,583,176 | 4/1986 | Yamato et al. | 364/431.11 |
| 4,667,176 | 5/1987 | Matsuda | 340/52 F |
| 4,694,408 | 9/1987 | Zaleski | 364/551 |
| 4,748,843 | 6/1988 | Schafer et al. | 73/117.3 |
| 4,809,177 | 2/1989 | Windle et al. | 364/424.01 |
| 4,843,557 | 6/1989 | Ina et al. | 364/431.77 |
| 4,896,276 | 1/1990 | Saglimbeni et al. | 364/550 |
| 4,967,143 | 10/1990 | Raviglione et al. | 324/73.1 |
| 4,975,848 | 12/1990 | Abe et al. | 364/424.03 |
| 4,977,389 | 12/1990 | Shiraishi | 340/461 |
| 5,019,799 | 5/1991 | Oshiage et al. | 340/438 |
| 5,034,889 | 7/1991 | Abe | 364/424.04 |
| 5,041,980 | 8/1991 | Maddock et al. | 364/431.03 |
| 5,050,080 | 9/1991 | Abe | 364/424.04 |
| 5,091,858 | 2/1992 | Paielli | 364/431.12 |
| 5,150,609 | 9/1992 | Ebner et al. | 73/117.3 |
| 5,157,610 | 10/1992 | Asano et al. | 364/424.03 |
| 5,214,582 | 5/1993 | Gray | 364/424.03 |
| 5,257,190 | 10/1993 | Crane | 364/424.03 |

FOREIGN PATENT DOCUMENTS

WO92/04693  3/1992  WIPO .

OTHER PUBLICATIONS

Caterpillar Service Manual–"Systems Operation Testing and Adjusting–Computerized Monitoring System with Liquid Crystal Display" published Oct. 1990.

Caterpillar Service Manual–"Computerized Monitoring System With LCD Bargraph Gauges", published Jan. 1991.

Journal Article–"Microelectronics takes to the road in a big way: a special report", pp. 113–122 in the Nov. 20, 1980 edition of Electronics.

Journal Article–"Expert-systems applied to earth-moving vehicle transmission troubleshooting", pp. 38–40 published in the Dec. 1990 edition of Automotive Engineer.

Publication entitled "Introducing the Vital Signs Monitor plus Load Weighing System", by Marathon LeTrouneau, published Jan. 1988.

Journal Article–"All on board with O & K" Jan. 1990.

*Primary Examiner*—Donnie L. Chosland
*Attorney, Agent, or Firm*—Steven R. Janda

[57] ABSTRACT

Systems for diagnosing fault conditions in a plurality of inputs are useful in many applications. Advantageously, such systems allow a technician to quickly and clearly identify the fault condition. The subject invention includes a plurality of sensors to produce a plurality of sensor signals. Each of the sensor signals is in one of a normal state or a fault condition and has an associated pin number. A plurality of indicator lights are also each associated with one of the sensor signals. A display individually indicates each pin number associated with a sensor signal in the fault condition. Each of the indicator lights associated with one of the sensor signals in the fault condition is flashed. The indicator light associated with the sensor signal for which the associated pin number is indicated by the display is steadily illuminated.

17 Claims, 4 Drawing Sheets

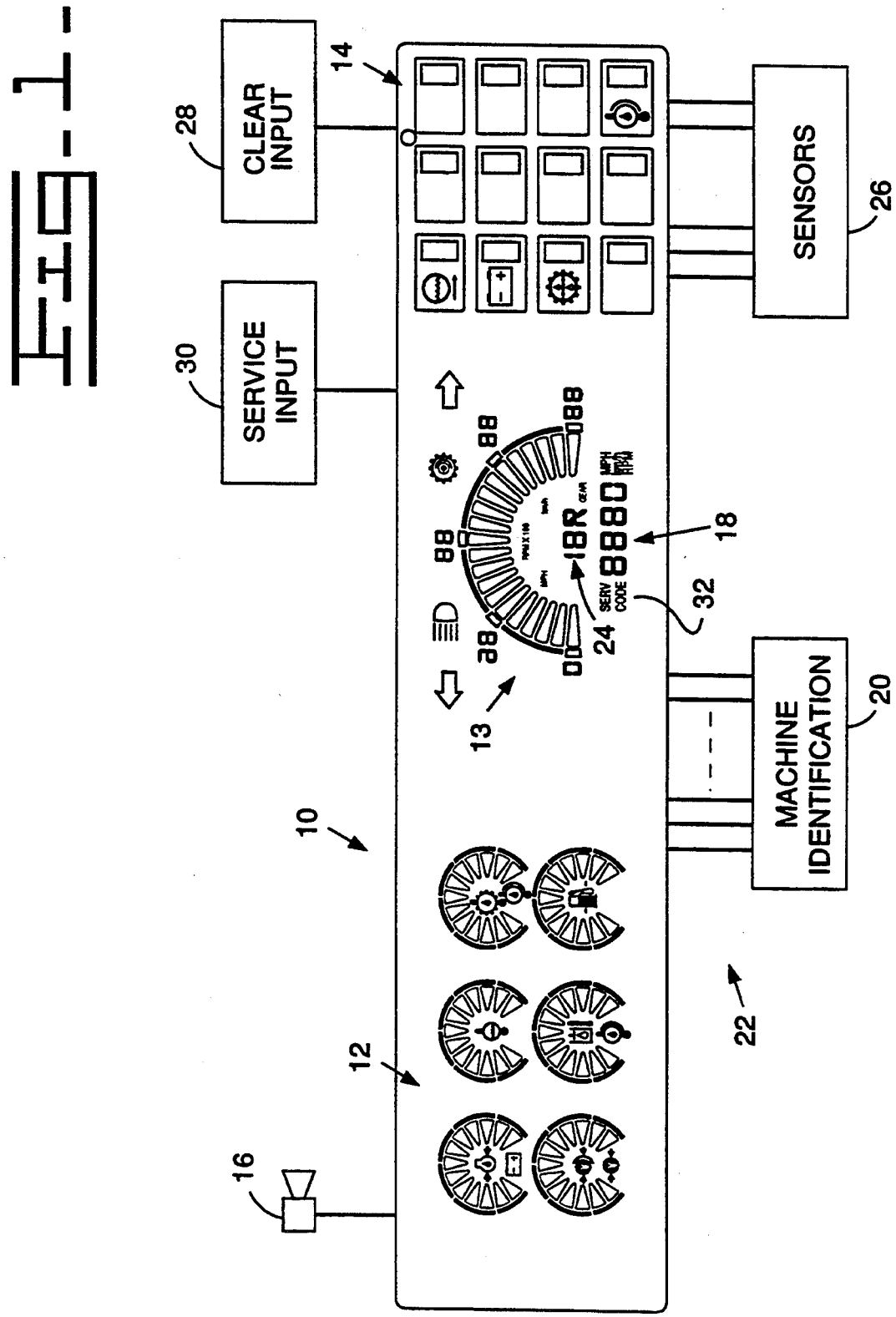

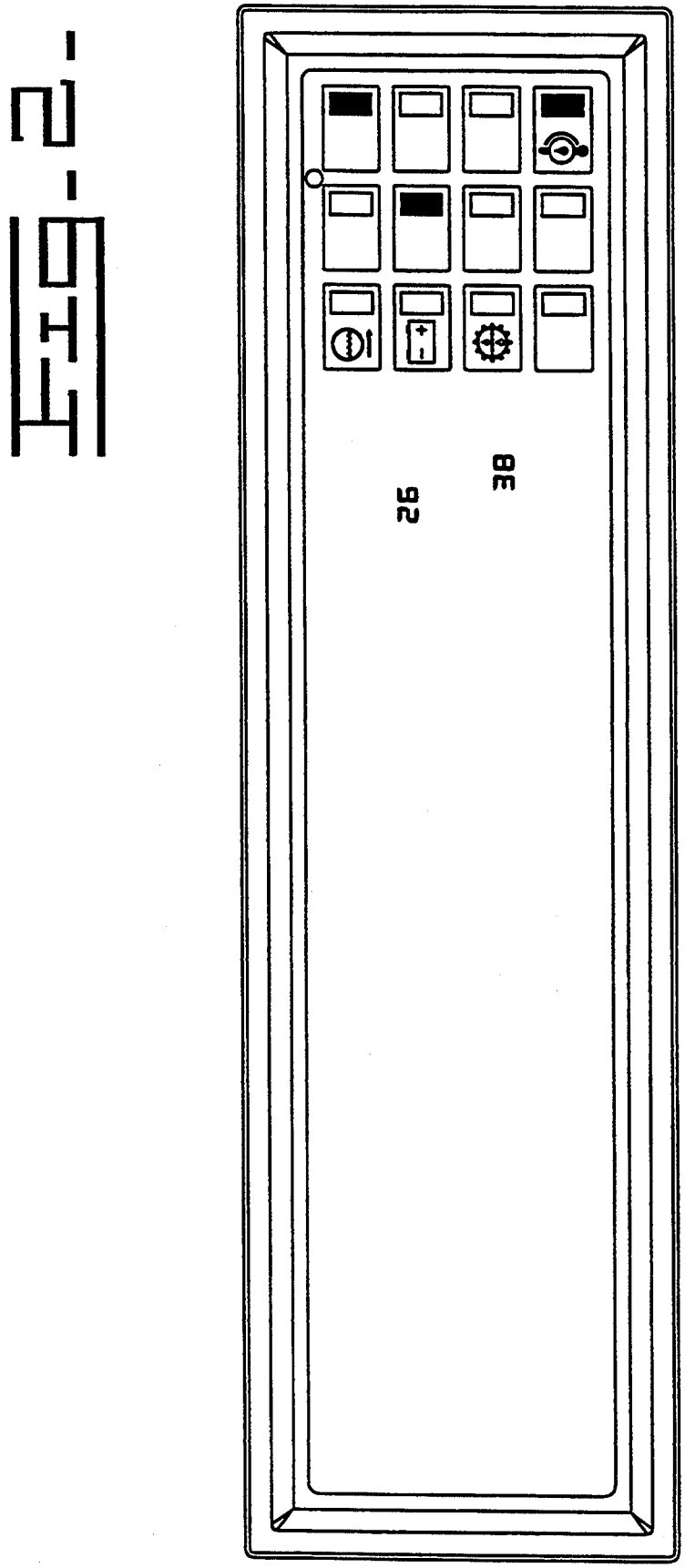

METHOD AND APPARATUS FOR INDICATING FAULTS IN SWITCH-TYPE INPUTS

TECHNICAL FIELD

This invention relates generally to diagnosing fault conditions on a plurality of inputs and, more particularly, to a method and apparatus for indicating that one of the inputs has changed states.

BACKGROUND ART

Today's machines, and particularly large off-highway work vehicles, are becoming increasingly complex in their design thus making it more and more difficult for service personnel to locate defects in machine sensors and systems. This is particularly true of intermittent defects not resulting in a breakdown of a system or the vehicle but which interfere with its operation.

A major frustration when troubleshooting electrical problems on a large work vehicle are the intermittent problems. Typically, the operator reports some symptom to a technician and before the technician can get to the machine the problem is no longer present.

If the condition is not present it is helpful for the technician to re-create the fault condition. In many cases the fault condition is caused by a short to ground potential or an open circuit. To recreate these fault conditions, the technician manipulates the wire harnesses or wire connectors to determine the point at which the fault has occurred.

Prior art systems have indicated when fault conditions are present. In connection with such systems, the technician must view a visual display to determine whether the condition is present. In troubleshooting intermittent problems when the fault condition is not currently present, the technician must manipulate wire harnesses and connectors to recreate the fault and thus cause the fault indication to be displayed. When the fault condition is present, the technician must manipulate wire harnesses and connectors and observe whether the manipulations eliminate the fault and thus cause the fault indication to disappear.

In many cases, however, the machine is of sufficient size that the technician must leave the area of the diagnostic tool to recreate the fault condition. Therefore, any visual indicator provided by the diagnostic tool is not visible to the technician. To effectively troubleshoot the electrical system on such a large machine, typically two or more technicians are required and repair expenses are thus greatly increased. Similarly, the vehicle may not be repairable immediately if only a single technician is available.

In addition, these machines typically include switch-type sensors that are either in an open voltage or grounded condition. One of the voltage conditions is defined as a fault condition. In most cases, the fault condition is defined as the open voltage condition thus whenever the wire between the sensor and the display is severed or disconnected, a fault condition is indicated. Similarly, when the parameter being sensed by the switch-type sensor is at a warning level to actuate the sensor, the switch-type sensor disconnects the sensor output from ground potential.

Some prior art systems have illuminated a warning light for each switch-type sensor that is in a fault condition. Each warning light is associated with one of the switch-type sensors and is illuminated when the display input associated with that switch-type sensor is indicating a fault condition. While adequate for many purposes, in other cases it is advantageous to also indicate the pin number of the input associated with the switch-type sensor. Optimally, the technician should be able to determine the pin number of each of the warning lights indicating a fault condition even though there are more than one of such warning lights. This would allow technicians to more readily identify the fault condition and associate the sensor having the fault condition to the relevant connector pin.

The present invention is directed at overcoming one or more of the problems as set forth above.

DISCLOSURE OF THE INVENTION

The invention avoids the disadvantages of known diagnostic systems and provides an instrument that is useful in connection with machines having one or more fault conditions.

In one aspect of the invention, an apparatus for indicating fault conditions is provided. A plurality of sensors produce a plurality of sensor signals. Each of the sensor signals is in one of a normal state or a fault condition and has an associated pin number. A plurality of indicator lights are also each associated with one of the sensor signals. A display individually indicates each pin number associated with a sensor signal in the fault condition. Each of the indicator lights associated with one of the sensor signals in the fault condition is flashed. The indicator light associated with the sensor signal for which the associated pin number is indicated by the display is steadily illuminated.

In another aspect of the invention, a method for indicating a fault condition is provided. The method includes the steps of producing a plurality of sensor signals, each of the sensor signals being in one of a normal state or a fault condition and having an associated pin number and indicator light; individually indicating each pin number associated with one of the sensor signals in the fault condition; flashing the indicator light associated with each of the sensor signals in the fault condition; and steadily illuminating the indicator light associated with the sensor signal for which the associated pin number is indicated by a display.

The invention also includes other features and advantages which will become apparent from a more detailed study of the drawings, specification, and appended claims.

BRIEF DESCRIPTION OF THE DRAWINGS

For a better understanding of the present invention, reference may be made to the accompanying drawings in which:

FIG. 1 illustrates a computerized monitoring and diagnostic system;

FIG. 2 illustrates the computerized monitoring and diagnostic system functioning in a status mode.

BEST MODE FOR CARRYING OUT THE INVENTION

Figure 3A:
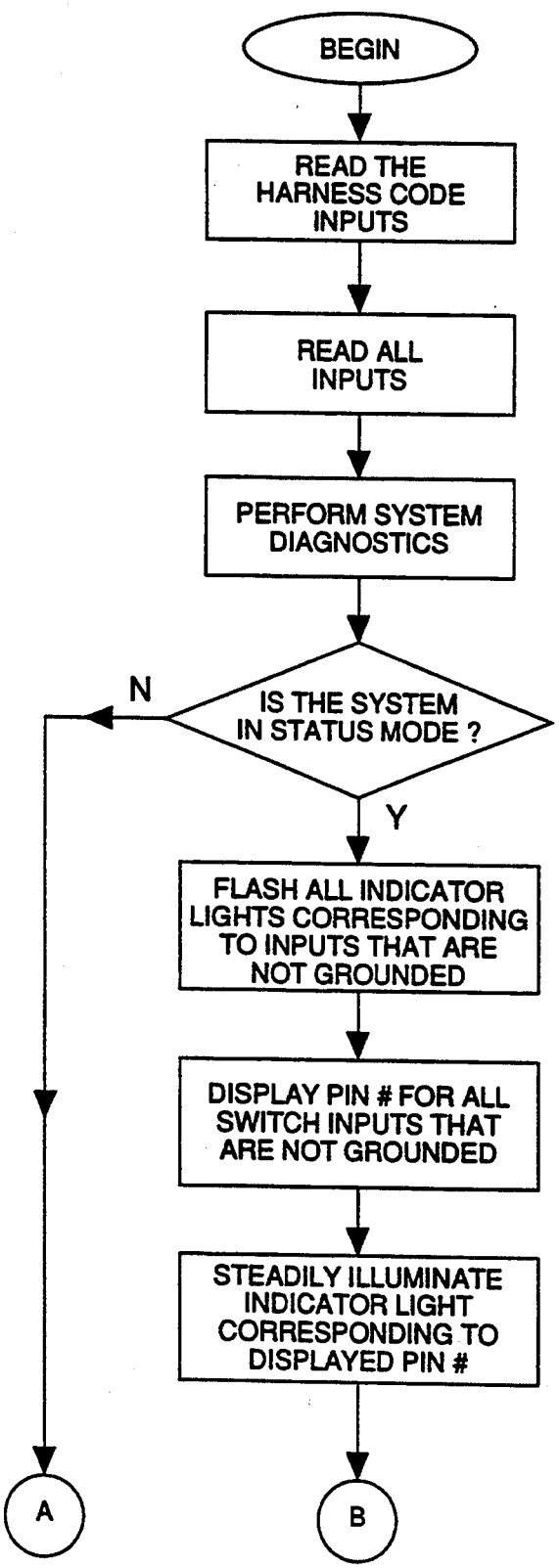
FIGS. 3a and 3b illustrate a flow chart of an algorithm executed in connection with a preferred embodiment of the invention.

An instrument for displaying parameter values is shown generally by the reference numeral 10 in FIG. 1. In the preferred embodiment, the instrument 10 is a computerized diagnostic and monitoring system for monitoring and displaying parameters and informing an operator by visible and/or audible indications when a warning condition exists. The instrument 10 is advantageously microprocessor based and functions in response to internal software. The instrument 10 includes a plurality of indicator lights 14, preferably LEDs, and a plurality of electronic gauges 12 having a plurality of illuminable segments, preferably of the vacuum fluorescent (VF) type. Advantageously, the instrument 10 is used in connection with a large work vehicle and is fixedly located in the operator's compartment such that an operator can view the parameter levels and any warning indication produced by the instrument 10.

The gauges 12 indicate the level of a plurality of sensed parameters, for example, ground speed, engine RPM, oil temperature, fuel level, transmission oil temperature, and the like, and may be used in connection with any of a plurality of different machine types. In the preferred embodiment, one of the gauges 12 is a speedo/tacho gauge 13 that displays either the speed of the vehicle or the RPM of the engine or transmission and includes scaling digits for displaying the magnitude of the sensed parameter at various points along the speedo/tacho gauge 13. Since the desired scaling digits may be different for each machine, the instrument 10 modifies the scaling digits in response to the machine to which the instrument 10 is connected.

Each gauge, except the central gauge indicating speedo/tacho information, is capable of indicating either a high warning condition or a low warning condition, i.e., sensed parameters being above or below a normal operating range.

Warning conditions are brought to the operator's attention by the indicator lights 14, a flashing gauge, a flashing alarm lamp, and/or a warning horn 16. Advantageously, the indicator lights 14 are flashed in response to switch-type inputs being in a fault or warning condition which is advantageously defined as being at an open voltage condition. If an input normally associated with a switch-type input is unused on the machine to which the instrument is connected, the indicator light 14 is not flashed and otherwise does not indicate a fault condition.

When used in connection with some machines, it is also desirable for the instrument 10 to include turn signal indicators, a hi-beam light indicator, and a retarder indicator for informing the operator that a transmission retarder is engaged, for example, on a large off-highway work vehicle. However, not all machines use all functional indicators. Thus the instrument 10 controllably enables each of the functional indicators needed by the machine to which the instrument 10 is connected. As is the case with the gauges, the functional indicators are also of VF design.

A VF digital display 18 is included to indicate either speedometer or tachometer information in digital form. In the preferred embodiment, one of the speedo/tacho gauge 13 and digital display 18 indicates speedometer information while the other indicates tachometer information; however, either speedometer or tachometer information may be indicated on both if so desired. Advantageously, the digital display 18 is also adapted to indicate the level of other parameters when the instrument 10 is operating in a numeric readout mode or diagnostic information when the instrument 10 is operating in diagnostic modes.

Advantageously, each machine type has an identification code to be delivered to the instrument 10 which responsively reconfigures itself to conform to the format chosen by the designer for that machine. In response to the identification code, the instrument 10 determines the parameter monitored at each input from the wire harness, the functional indicators to be illuminated, the type of display brightness control to be used, the parameter to be displayed on each gauge, the status report level for each input, the gauges to be used, the data to be transmitted over the communication link to other electronic controls, the signal filtering, debounce, scaling, or averaging characteristics associated with each input, and the functional relationship between each parameter value and the gauge reading. Likewise, the switch-type input associated with each indicator light 14 is defined for each machine type on which the instrument 10 is used in response to the identification code.

An identification means 20 produces the identification code. In the preferred embodiment, the identification means 20 is connected to the instrument 10 via one or more identification lines 22 forming part of the wire harness and carrying the identification code.

In the preferred embodiment, the identification code is in the form of binary signals produced by connecting each of the identification lines 22 to a ground input potential or allowing the voltage of the identification line to float in response to any voltage to which the identification line 22 is connected. In the preferred embodiment, the identification means 20 directly connects the identification lines 22 to a terminal having one of the above described voltage characteristics; however, it should be appreciated that the identification lines 22 could be connected to a switch-type device for connection to a ground input potential or a floating terminal. While the preferred embodiment of the invention is described in connection with a ground input potential and a floating or open voltage condition, it should be appreciated that the particular states of the binary signals could be modified without deviating from the spirit of the invention.

In general, the machine dependent functions and displays described herein are determined in response to the identification code, although other inputs may be used to determine such things as whether the gauges 12 will display in a fill-the-graph or a single-bar mode and whether speed will be displayed in MPH or km/h. Typically, the instrument 10 retrieves a number of identifiers from a memory device (not shown) within the instrument 10 in response to receiving the identification code. The instrument 10 uses the identifiers to determine which functions and displays are to be used in connection with machines having the received identification code.

In addition to the above warning indications, the warning horn 16 or the alarm lamp may be activated when the level of the sensed parameter exceeds a high or low warning value.

A gear display 24 is disposed adjacent the digital display 18 and advantageously indicates the number and direction, i.e. forward, neutral, or reverse, of a vehicle transmission.

The instrument 10 is connected to each of a plurality of sensors 26 by wire. The instrument 10 preferably performs some processing of signals received from the sensors over the wire harness and scales the signals received from pulse-width modulated type sensors and frequency based sensors in manners well-known in the art. Similarly, the instrument 10 receives signals from switch-type sensors. The signals associated with these inputs are received by the instrument 10, but generally no scaling is required.

In the preferred embodiment, the instrument 10 includes a plurality of operating modes for use in normal operation and as a diagnostic tool. The operating modes preferably include a normal display mode, a service mode, a status mode, a tattletale mode, and a numeric display mode. While in a normal display mode, the instrument 10 displays sensed parameter levels and indicates warning conditions in response to sensed parameters being outside a given range.

The instrument 10 preferably includes terminals for receiving signals from a clear input 28 and a service input 30. A service tool is advantageously included having two single-pole, single-throw (SPST) switches corresponding to the clear input 28 and service input 30. The technician actuates the switches to selectively ground the clear input 28 and service input 30. The service and clear inputs 28,30 are advantageously used by the technician to select the mode of operation for the instrument 10 and to provide commands to the instrument 10 when operating in one or more of the modes of operation. It should be understood, however, that many other devices may be used to select a desired operating mode.

The instrument 10 automatically enters the normal display mode of operation when power is applied. To access other display modes, the service and clear inputs 28,30 are grounded simultaneously. When both inputs 28,30 are grounded, a mode number corresponding to the current operating mode appears on the digital display 18. Preferably, the five operating modes are numbered from 0 through 4. If the service and clear inputs 28,30 both remain grounded for advantageously 2 seconds, the instrument 10 begins scrolling through the modes. When the desired mode is reached, i.e. the mode number corresponding to the desired operating mode is displayed on the digital display 18, the technician locks on to that mode by disconnecting the service and clear inputs 28,30 from ground.

Vital vehicle functions are monitored and reported on the instrument display panel in the normal display mode. The instrument 10 monitors itself and the I/O circuits for status, for intermittent-fault conditions, and for currently present fault conditions. The instrument 10 monitors both diagnosable inputs, i.e. those inputs that can be detected as being outside a valid range, and switch-type, non-diagnosable inputs. The instrument 10 also retains fault information relating to fault conditions on diagnosable inputs in non-volatile memory (not shown) within the instrument 10. Thus, the memory device (not shown) includes indications of each fault condition relating to a diagnosable input that has existed on the machine whether or not the fault condition is currently present. However, fault conditions on switch-type inputs are only indicated when present. Advantageously, the service and clear inputs 28,30 may be used to clear the stored fault information in one or more of the diagnostic modes.

Referring now primarily to FIG. 2, the status mode is preferably used to identify fault or warning conditions in switch-type inputs that are not easily diagnosed and are generally used in connection with the indicator lights 14. The switch-type inputs advantageously include switch inputs, vehicle identification codes, and various other inputs having a limited number of possible states and indicate one of a normal state and a fault condition. Advantageously, the fault condition corresponds to an open or floating voltage condition.

Some of the inputs are used to program the instrument 10 to perform certain functions and may be either at ground potential or an open or floating voltage condition and are thus treated as switch-type inputs in the status mode. For the purposes of discussion, the term fault condition with respect to the switch-type inputs is used generically to refer to an open voltage condition. It should be appreciated, however, that other voltage conditions or electrical signals could be defined as corresponding to the fault condition without deviating from the invention. Thus, the programming inputs are referred to as being in the fault condition when in the open voltage condition even though it may in fact be desirable for that programming input to be at the open voltage condition. Similarly, when a switch-type sensor produces an open voltage condition on one of the switch-type inputs in response to the sensed parameter being outside a normal operating range, the switch-type input is also referred to as being in a fault condition.

The indicator light 14 function while in the status mode is advantageously defined such that an indicator light 14 is flashed when the associated switch-type input is in an open voltage condition and is turned off when the associated input is at ground potential. In the preferred embodiment, there are more switch-type inputs to be indicated in the status mode than the number of available indicator lights 14. To indicate all of the desired inputs, the clear input 28 is used to toggle between two sets of inputs. Thus when the clear input 28 is grounded, one set of inputs is displayed on the indicator lights 14 and when the clear input 28 is open, the other set of inputs is displayed. Advantageously, the inputs are divided into a group including predominantly switch-type sensors and a group including predominantly programming inputs.

Each of the switch-type inputs, including both the switch-type sensors and the programming inputs, is assigned a pin number corresponding to the connector contact number on which the signal is received. In addition, each of the switch-type inputs being selected by the clear input 28 is assigned to one of the indicator lights 14. As set forth above, when there are more switch-type inputs than indicator lights 14, only a select group of inputs are assigned to the indicator lights 14 in response to the state of the clear input 28. Advantageously, a table is also provided for reference by the technician to aid in identification of the switch-type input corresponding to each of the pin numbers and indicator lights 14.

Pin number(s) of monitored conditions presently in a fault condition are shown/scrolled on the 2 digits normally used to show the full-scale units for the speedo/tacho gauge 13. It should be noted that all pin numbers corresponding to inputs presently in a fault condition are displayed regardless of the state of the clear input 28. When the pin number is shown for a parameter presently displayed by an indicator light 14, that indicator light is steadily illuminated rather than flashed. If the condition changes, i.e. the parameter goes to a non-fault condition, the indicator light 14 turns off and the pin number is no longer displayed as being in a fault condition. As described above, the indicator lights 14 are only flashed or steadily illuminated in response to the state or pin number display, respectively, of inputs to which they are assigned in response to the state of the clear input 28.

Pin number(s) are also displayed for a status change of any of the parameters monitored in the status mode, e.g., a change from open to ground or ground to open. In the case of multiple changes, the pin numbers are scrolled. As is the case with those inputs in the fault condition, all pin numbers having changed state are scrolled regardless of the state of the clear input 28. These pin numbers are displayed on the 2 digits normally used to display the three-fourths-of-full scale units for the speedo/tacho gauge 13. The pin number information relating to inputs having changed status is erased from memory in response to leaving the status mode by simultaneously grounding the service and clear inputs 28,30.

The warning horn 16 is used in the status mode to augment the usefulness of the indicator lights 14. The warning horn 16 sounds briefly each time one of the switch-type inputs changes state. The sounding of the warning horn 16 occurs for any of the parameters available in status mode. The augmentation added by the warning horn 16 makes it possible for the technician to determine when a change-of-state has occurred even when working remotely from the instrument 10 which is advantageously fixedly located in the operator's station of a vehicle.

Figure 3B:
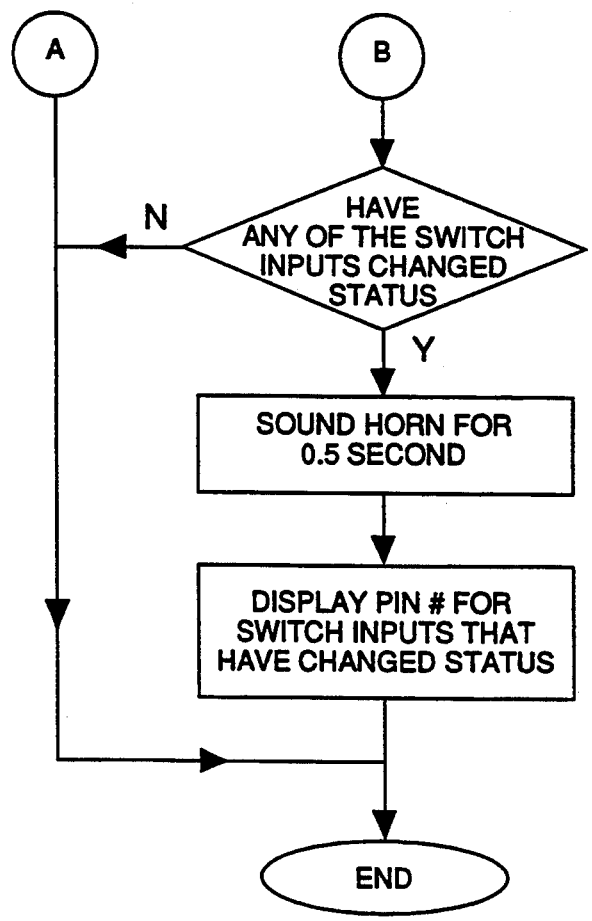

Referring now to FIGS. 3a and 3b, a flow chart of an algorithm executed by the instrument 10 in a preferred embodiment of the invention is shown. The instrument 10 reads the identification code and responsively retrieves a number of identifiers from a memory device (not shown) within the instrument 10. The identifiers are defined such that the microprocessor (not shown) within the instrument 10 determines, for that particular machine, the parameter monitored at each input from the wire harness, the parameter to be displayed on each gauge, the status report level for each input, the signal filtering, debounce, scaling, or averaging characteristics associated with each input, and the switch-type input associated with each indicator light 14. The instrument 10 reads all of the inputs being used in connection with the machine to which it is connected and performs the system diagnostics on those inputs as described above.

If the instrument 10 is in the status mode, the instrument 10 stores the status, i.e., grounded or open voltage condition, in memory for each of the switch-type inputs. In response to one of the switch-type inputs being in an open voltage condition, the instrument 10 produces a command causing the 2 digits normally used to display the full-scale units for the speedo/tacho gauge 13 to indicate the pin number associated with that switch-type input. If more than one switch-type input is in an open voltage condition, the instrument 10 causes the pin numbers to scroll by alternatively producing commands to display each of the pin numbers. The instrument 10 also reads the clear input 28 and responsively produces a command to flash each of the indicator lights 14 assigned to one of the switch-type inputs having an open circuit condition. Each time a pin number corresponding to one of the indicator lights 14 assigned to one of the switch-type inputs being in an open circuit condition is displayed on the full-scale units of the speedo/tacho gauge 13, the instrument causes that indicator light 14 to be steadily illuminated rather than flashed.

The instrument 10 also determines whether any of the switch-type inputs have changed status by comparing the current status of each of the switch-type inputs to the status stored in memory for that input. If any of the switch type inputs have changed status, the instrument 10 stores the new status in memory, produces a control signal causing the warning horn 16 to produce an audible signal for advantageously 0.5 seconds, and produces a command causing the 2 digits normally used to display the three-fourths-of-full-scale units for the speedo/tacho gauge 13 to indicate the pin number associated with the changed input. If more than one switch-type input has changed status, the instrument 10 causes the pin numbers to scroll by alternatively producing commands to display each of the pin numbers.

Within the status mode, the function of determining whether each of the inputs have changed status is repeated at predefined intervals. Advantageously, the interval is selected to be sufficiently short that substantially any intermittent change of status caused by manipulations of the wire harness or connectors by the technician is detected.

INDUSTRIAL APPLICABILITY

The operation of a preferred embodiment of the present invention is best described in connection with a computerized monitoring and diagnostic system. In the preferred embodiment, the instrument 10 includes a plurality of operating modes for use in displaying parameter values and as a diagnostic tool. The operating modes preferably include a normal display mode, a service mode, a status mode, a tattletale mode, and a numeric display mode.

The instrument 10 preferably includes terminals for receiving signals from a clear input 28 and a service input 30. The service and clear inputs 28,30 are used to select the mode of operation for the instrument 10 and to provide commands to the instrument 10 when operating in one or more of the modes of operation.

The instrument 10 automatically enters the normal display mode when power is applied. To access other display modes, the technician grounds the service and clear inputs 28,30 simultaneously. When both inputs 28,30 are grounded, a mode number corresponding to the current operating mode appears on the digital display 18. If both inputs remain grounded for advantageously 2 seconds, the instrument 10 begins sequencing through the modes. When the desired mode is reached, i.e. the mode number corresponding to the desired operating mode is displayed on the digital display 18, the technician "locks" onto that mode by disconnecting the service and clear inputs 28,30 from ground.

When in the status mode, the indicator lights 14 are used diagnostically to indicate the status of various inputs. In response to being assigned to a group of switch-type inputs through activation of the clear input 28, each indicator light 14 assigned to a switch-type input being in a fault, i.e. open voltage, condition is flashed. The pin numbers of each switch-type input in a fault condition is individually displayed by the instrument. Each time a pin number corresponding to one of the flashing indicator lights 14 is displayed, that indicator light 14 is steadily illuminated rather than flashed.

The pin numbers of each switch-type input having changed states is also displayed. The warning horn 16 augments the usefulness of the indicator lights 14 by sounding briefly each time any of the switch-type inputs changes states. The augmentation allows the technician to determine when a switch-type input has changed state even when working remotely from the instrument 10. The pin numbers of switch-type inputs having changed status are also displayed to provide the technician with a visual indication of which inputs have changed state.

Any specific values used in the above descriptions should be viewed as exemplary only and not as limitations. Other aspects, objects, and advantages of this invention can be obtained from a study of the drawings, the disclosure, and the appended claims.

We claim:

1. An apparatus for indicating fault conditions, comprising:
   a plurality of sensor means for sensing a plurality of sensor signals, each of said sensor signals being in one of a normal state or a fault condition and having an associated pin number;
   a plurality of indicator lights, each of said indicator lights being associated with one of said plurality of sensor signals;
   display means for individually indicating each pin number associated with a sensor signal being in said fault condition;
   means for flashing each of said indicator lights being associated with one of said plurality of sensor signals being in said fault condition; and
   means for causing the indicator light associated with the sensor signal for which the associated pin number is being indicated by said display means to be steadily illuminated instead of being flashed.

2. An apparatus, as set forth in claim 1, including means for producing a diagnostic signal in response to one or more of said sensor signals changing from said normal state to said fault condition or from said fault condition to said normal state.

3. An apparatus, as set forth in claim 2, including an audio warning means for producing an audible signal and wherein said means for producing a diagnostic signal causes said audio warning means to produce said audible signal.

4. An apparatus, as set forth in claim 2, wherein said means for producing a diagnostic signal causes said display means to indicate the pin number associated with each of said plurality of sensor signals having changed from said normal state to said fault condition or from said fault condition to said normal state.

5. An apparatus for indicating a fault condition, comprising:
   a plurality of sensor means for sensing a plurality of parameters and responsively producing a plurality of sensor signals, each of said sensor signals being in one of a normal state or a fault condition and having an associated pin number;
   display means for indicating parameter levels and the presence of one or more fault or warning conditions, said display means being operable in a normal display mode and a diagnostic mode and having a plurality of indicator lights, each of said indicator lights being associated with one of said plurality of sensor signals;
   means for flashing each of said indicator lights having an associated sensor signal in said fault condition; and
   signalling means for causing said display means to indicate said parameter levels in response to said display means being in said normal display mode and, in response to said display means being in said diagnostic mode, to individually indicate each pin number associated with a sensor signal being in said fault condition and to cause the indicator light associated with the sensor signal for which the associated pin number is being indicated by said display means to be steadily illuminated rather than being flashed.

6. An apparatus, as set forth in claim 5, wherein:
   said display means includes a gauge means for displaying the level of a parameter and a first scaling digit means for indicating the scale of said gauge means; and
   said signalling means causes said first scaling digit means to display a number being indicative of the scale of said gauge means in response to said display means being in said normal display mode and to display, in response to said display means being in said diagnostic mode, the pin number associated with each of said plurality of sensor signals being in said fault condition.

7. An apparatus, as set forth in claim 6, wherein:
   said display means includes a second scaling digit means; and
   said signalling means causes said second scaling digit means to display a number being indicative of the scale of said gauge means in response to said display means being in said normal display mode and to display, in response to said display means being in said diagnostic mode, the pin number associated with each of said plurality of sensor signals having changed from said fault condition to said normal state or from said normal state to said fault condition.

8. An apparatus, as set forth in claim 5, wherein said plurality of sensor means are switch-type sensors having a limited number of states and said diagnostic mode is a status mode for troubleshooting said switch-type sensors.

9. An apparatus, as set forth in claim 5, including means for producing a diagnostic signal in response to one or more of said sensor signals changing from said normal state to said fault condition or from said fault condition to said normal state.

10. An apparatus, as set forth in claim 9, including an audio warning means for producing an audible signal and wherein said means for producing a diagnostic signal causes said audio warning means to produce said audible signal.

11. An apparatus, as set forth in claim 9, wherein said means for producing a diagnostic signal causes said display means to indicate the pin number associated with each of said plurality of sensor signals having changed from said normal state to said fault condition or from said fault condition to said normal state.

12. An apparatus, as set forth in claim 5, wherein said plurality of sensor signals are greater in number than said plurality of indicator lights and including means for selecting one of a first and a second group of said plurality of sensor signals and responsively assigning each of the selected sensor signals to one of said indicator lights.

13. A method for indicating fault conditions, comprising the steps of:
   producing a plurality of sensor signals, each of said sensor signals being in one of a normal state or a fault condition and having an associated pin number and indicator light;
   individually indicating each pin number associated with one of the plurality of sensor signals being in the fault condition;
   flashing the indicator light associated with each of the plurality of sensor signals being in the fault condition; and steadily illuminating, and thereby preventing from flashing, the indicator light associated with the sensor signal for which the associated pin number is being indicated.

14. A method, as set forth in claim 13, including the step of selecting one of a normal display mode and a diagnostic mode.

15. A method, as set forth in claim 13, including the step of producing a diagnostic signal in response to one or more of the sensor signals changing from the normal state to the fault condition or from the fault condition to the normal state.

16. A method, as set forth in claim 15, wherein the step of producing a diagnostic signal includes the step of producing an audible signal.

17. A method, as set forth in claim 15, wherein the step of producing a diagnostic signal includes the step of indicating each pin number associated with a sensor signal having changed from the normal state to the fault condition or from the fault condition to the normal state.

* * * * *